(12) United States Patent
Renous et al.

(10) Patent No.: US 6,741,132 B2
(45) Date of Patent: May 25, 2004

(54) LOW NOISE LEVEL DIFFERENTIAL AMPLIFIER

(75) Inventors: Claude Renous, Grenoble (FR); Kuno Lenz, Voreppe (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/319,425

(22) Filed: Dec. 12, 2002

(65) Prior Publication Data

US 2003/0137351 A1 Jul. 24, 2003

(30) Foreign Application Priority Data

Dec. 12, 2001 (FR) ............................. 01 16052

(51) Int. Cl.$^7$ ............................. H03F 3/45; H03F 1/14; H03F 1/02
(52) U.S. Cl. ............................. 330/260; 330/292; 330/9
(58) Field of Search ................................ 330/260, 292, 330/9

(56) References Cited

U.S. PATENT DOCUMENTS

| | | | |
|---|---|---|---|
| 4,533,876 A | | 8/1985 | Haque et al. ................. 330/253 |
| 4,538,116 A | * | 8/1985 | Vyne ........................... 330/271 |
| 4,912,427 A | | 3/1990 | Rybicki ....................... 330/257 |
| 5,392,784 A | * | 2/1995 | Gudaitis ...................... 600/508 |
| 5,485,121 A | * | 1/1996 | Huijsing et al. ............. 330/260 |
| 5,877,654 A | | 3/1999 | Fong et al. .................. 330/292 |

FOREIGN PATENT DOCUMENTS

EP        1 083 655 A2      3/2001

OTHER PUBLICATIONS

Tomasini, L. et al., "A Fully Differential CMOS Line Driver for ISDN," *IEEE Journal of Solid–State Circuits*, 25(2):546–554, Apr., 1990.

* cited by examiner

*Primary Examiner*—Patricia Nguyen
(74) *Attorney, Agent, or Firm*—Lisa K. Jorgenson; Dennis M. de Guzman; Seed IP Law Group PLLC

(57) ABSTRACT

A low noise differential amplifier structure comprising a first amplifier provided with an output stage with a Miller capacitor having a first electrode and a second electrode connected to the input and the output of the output stage, respectively. A second amplifier is provided with an output stage with a Miller capacitor having a first electrode and a second electrode connected to the input and the output of the output stage, respectively. The structure is characterized in that it comprises: at least a first trimming capacitor having a first electrode connected to the first electrode of the first Miller capacitor; at least a second trimming capacitor having a first electrode connected to the first electrode of the second Miller capacitor; and a cascode stage having an input receiving the output common mode voltage and an output connected to the second electrode of the first and second trimming capacitors.

15 Claims, 6 Drawing Sheets

LOW NOISE LEVEL DIFFERENTIAL AMPLIFIER

BACKGROUND OF THE INVENTION

1. Field of the Invention

The present disclosure generally relates to the field of amplifier circuits, and in particular but not exclusively to a low noise level amplifier circuit.

2. Description of the Related Art

Low noise amplifier circuits are frequently used in the field of telecommunications and in particular in designing telephone interface circuits.

With some applications, it can happen that a relatively large input impedance—about several kilo-ohms—must be provided for. Such an impedance value is likely to generate non-negligible noise on the amplifier's input since noise varies in increase ratio to the square root of the input impedance. To minimize the effects of noise, a Low Noise Amplifier structure is then used, that is based on amplifiers mounted as cascode circuits, as illustrated in FIG. 1. A first and a second differential amplifier 110 and 120, receive a signal, respectively INP and INN, on their respective positive input via a bypass capacitor C, respectively 114 and 124. Differential mode gain is set by a voltage divider bridge R1–R2, respectively 130–140 for amplifier OA1 and 150–160 for amplifier OA2, that makes it possible to feed part of the output voltage (resp. OUTP and OUTN) back into the switch input of the amplifiers.

A resistor 100 having a value R is connected between the positive input of OA1 and the positive input of OA2 and makes it possible to set the circuit input impedance.

The noise generated by resistor 100 is filtered through network R-C resulting from the presence of bypass capacitor C (respectively 114 and 124) before it reaches the inputs of the amplifiers. For this reason such an amplifier structure, based on stages mounted as a cascode circuit, proves to be particularly adapted to design amplifiers having a large input impedance.

Nevertheless, the known circuit of FIG. 1 faces a stabilization problem for both amplifiers 110 and 120. Indeed, to avoid them from starting to oscillate at high frequencies, the amplifier's gain is made to drop down when approaching a critical phase shift of 180 degrees. This gain drop is classically operated by means of a capacitor Cm, known as a Miller capacitor, respectively 111 and 121 in FIG. 1, and more detailed in FIG. 2. In FIG. 2, a conventional differential amplifier structure comprising a first stage formed by a differential pair 112–113, a power source 114 and a current mirroring circuit 115–116 is shown. A second stage comprises a transistor 117, for example a MOS-type transistor, and a power source 118. Generally, the Miller capacitor is connected between the input and the output of the last stage, i.e., in the circuit of FIG. 2, between the grid and the drain of transistor 117. Gain can thus efficiently drop when approaching the critical zone where output and input signals are phase-shifted by 180 degrees. It is observed that connecting a capacitor Cmc 119 between grid and voltage Vdd also allows to obtain gain drop, but with quite less effectiveness than with a Miller capacitor. Because of the presence of gain K of the last stage, a capacitor Cmc equal to Cm×K would be necessary to obtain two equivalent effects and, for this reason, a Miller capacitor is rather preferred to obtain amplifier stabilization.

Generally, this capacitor Cm is dimensioned according to the gain of the stage to stabilize. The lower the gain, the larger the value of this capacitor must be. The circuit of FIG. 1 however has a gain that is different according to whether it operates in differential mode or in common mode. Indeed, in differential mode gain is set by the ratio of resistors, while in common mode, gain is equal to 1.

Stabilizing the circuit for common mode thus means choosing a capacitor Cm having a large value, whereas a much lower value could be chosen in differential mode, in particular in order to preserve the amplifier's gain-band product. Thus a dilemma arises: either stabilizing the circuit of FIG. 1 for both common and differential modes, and in this case the largest capacitor value is chosen, which results in performance degradation in differential mode, or stabilizing only the differential mode in order to maintain performance in this mode, and then facing stability problems for the common mode.

FIG. 3 shows a known way of solving this problem. An amplifier circuit is based on two amplifiers 310 (OA1) and 320 (OA2) that are mounted as cascode amplifiers by means of a network R1–R2 made up of resistors 330–340 and 350–360, respectively. Two inputs, respectively INP and INN, are connected to the positive input of OA1 via a capacitor 314 and to the positive input of OA2 via a capacitor 315. The input impedance of the circuit is set by a resistor 300. Contrary to the circuit of FIG. 1, voltage VCM of the divider bridge's midpoint is now set, at the junction between resistors 340 and 350, by means of an amplifier 370 (OA3) that is mounted as a cascode circuit. This circuit has a positive input that is connected to the midpoint of a resistor bridge (Rs 391 and 392), having a voltage stabilized at low frequency by a capacitor 393. If a sufficiently large value C of capacitor 393 is chosen, the output of amplifier 370 is more or less stabilized and thus voltage VCM is set to virtual ground.

Thus, for both stages 310 and 320, a common mode gain can be obtained that is identical to the differential mode gain, which makes it possible to stabilize amplifiers OA1 and OA2 in both modes and with an optimal value when considering the gain-band product. Indeed a single value Cm, when judiciously selected, makes it possible to obtain stabilization in differential mode and in common mode without any loss of performance.

This is the conventional way to stabilize both amplifiers OA1 and OA2. However, it can be observed that the stabilization problem is just transferred to the third amplifier OA3, that must also be associated with a Miller capacitor 380 that will have to be particularly effective, and in particular when approaching the critical operation zone for stages 310 and 320. Indeed, it will be in this zone that amplifier OA3 will be particularly used and thus likely to output large currents to maintain voltage VCM to virtual ground. Besides, the existence of an offset will amplify currents, especially as resistor R1 will have a low value. Designing amplifier OA3 is thus particularly delicate to do.

It is therefore desired to design a new low noise amplifier structure allowing to obtain stabilization more easily, in common mode as well as in differential mode.

BRIEF SUMMARY OF THE INVENTION

One embodiment of the present invention provides a low noise amplifier structure that is easy to stabilize in common mode as well as in differential mode, and without loss of performance.

Another embodiment of the invention provides a low noise amplifier circuit that consumes less current and occupies less room.

An embodiment provides an amplifier structure including:
- a first amplifier comprising at least one input stage and one output stage;
- a first Miller capacitor having a first electrode and a second electrode, said first and second electrodes being connected to the input and the output of said first amplifier's output stage, respectively;
- a second amplifier comprising at least one input stage and one output stage;
- a second Miller capacitor having a first electrode and a second electrode, said first and second electrodes of the second Miller capacitor being connected to the input and the output of said second amplifier's output stage;

wherein the amplifier structure comprises:
- at least a first trimming capacitor having a first electrode and a second electrode, said first electrode being connected to said first electrode of said first Miller capacitor;
- at least a second trimming capacitor having a first electrode and a second electrode, said first electrode being connected to said first electrode of said second Miller capacitor;
- a cascode stage having an input and an output, said cascode stage input being connected to the midpoint of a resistive bridge connected between the output of said first amplifier and the output of said second amplifier; said cascode stage output being connected to the second electrode of said trimming capacitors.

An effective compensation of each amplifier is thus obtained through combination of Miller capacitors and trimming capacitors, which leads to a discriminated effect in common mode, and in differential mode. The amplifier loops can thus be stabilized in both modes, while preserving a high gain-band product in differential mode.

Indeed, in common mode, the output of the cascode stage follows outputs OUTP and OUTN, which comes down to connecting the trimming capacitors in parallel with the Miller capacitors associated thereto. A more effective stabilization is thus obtained that is equivalent to a single Miller capacitor of value Cm+Cmc.

On the contrary, in differential mode, the output of the cascode circuit remains virtually set to ground, which destroys the Miller effect for both trimming capacitors. Thus, that comes down to having a Miller capacitor having a value Cm+Cmc/k, where K is the gain of the last stage.

Trimming of both amplifiers is thus obtained, which is different according to whether one operates in common mode or in differential mode. In common mode, both amplifiers can be stabilized by judiciously choosing values Cm+Cmc while in differential mode, the effects of an equivalent capacitor Cm+Cmc/k will be at least substantially satisfactory since in that mode it is important to preserve performances in the whole desired signal bandwidth.

Moreover, it is observed that the cascode stage does not have to output any D.C. current, which makes it even easier to design. Thus, the disadvantages of the particularly delicate to conceive known circuit are avoided. In a particular embodiment, the trimming circuit can be realized by a MOS-type transistor mounted in series with a power source to constitute a cascode stage having an output connected to the second electrode of said first and second trimming capacitors.

A first, a second, a third and a fourth resistors are connected in series between outputs (OUTP) and (OUTN) of said first and second amplifiers. The first amplifier has a positive input receiving input signal INP and a negative input that is connected to the midpoint between the first and second resistors. The second amplifier has a positive input receiving input signal INN and has a negative input that is connected to the midpoint between the third and fourth resistors.

In another embodiment, two variable potentiometers are connected in series between the outputs of the first and second amplifiers to obtain a variable gain amplifier circuit.

In an embodiment, each amplifier is associated with a single trimming capacitor by a compensating circuit comprising an associated Miller capacitor.

Alternatively, a set of trimming capacitors associated with switches can be provided to allow perfect trimming according to the gain of the amplifier.

Thus, in any circumstance amplifiers are stabilized, whatever their gain is, and the place occupied by the trimming capacitors can be reduced.

Alternatively, current consumption can be reduced by replacing the third amplifier with two trimming circuits each including a capacitor bridge.

More specifically, one embodiment of the invention also allows to realize a low noise amplifier circuit including:
- a first amplifier comprising an output stage;
- a first Miller capacitor having a first electrode and a second electrode, said first and second electrodes of said first Miller capacitor being connected to the input and the output of said output stage of the first amplifier;
- a second amplifier comprising an output stage;

characterized in that it comprises:
- a first trimming circuit including:
  - a first capacitor comprising a first electrode and a second electrode, the first electrode being connected to output (OUTP) of said first amplifier;
  - a second capacitor comprising a first electrode and a second electrode, said first electrode of said second capacitor being connected to said second electrode of said first capacitor and to said first electrode of said second Miller capacitor; said second electrode of said second capacitor being connected to output (OUTN) of said second amplifier;
- a second trimming circuit including:
  - a third capacitor comprising a first electrode and a second electrode, the first electrode being connected to output (OUTP) of said first amplifier;
  - a fourth capacitor comprising a first electrode and a second electrode, said first electrode of said fourth capacitor being connected to said second electrode of said third capacitor and to said first electrode of said first Miller capacitor; said second electrode of said fourth capacitor being connected to output (OUTN) of said second amplifier.

BRIEF DESCRIPTION OF THE SEVERAL VIEWS OF THE DRAWINGS

Further features of embodiments of the invention will become apparent when reading the following description and its accompanying drawings, provided by way of example only, where.

DETAILED DESCRIPTION OF THE INVENTION

Embodiments of a low noise level differential amplifier are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 4:
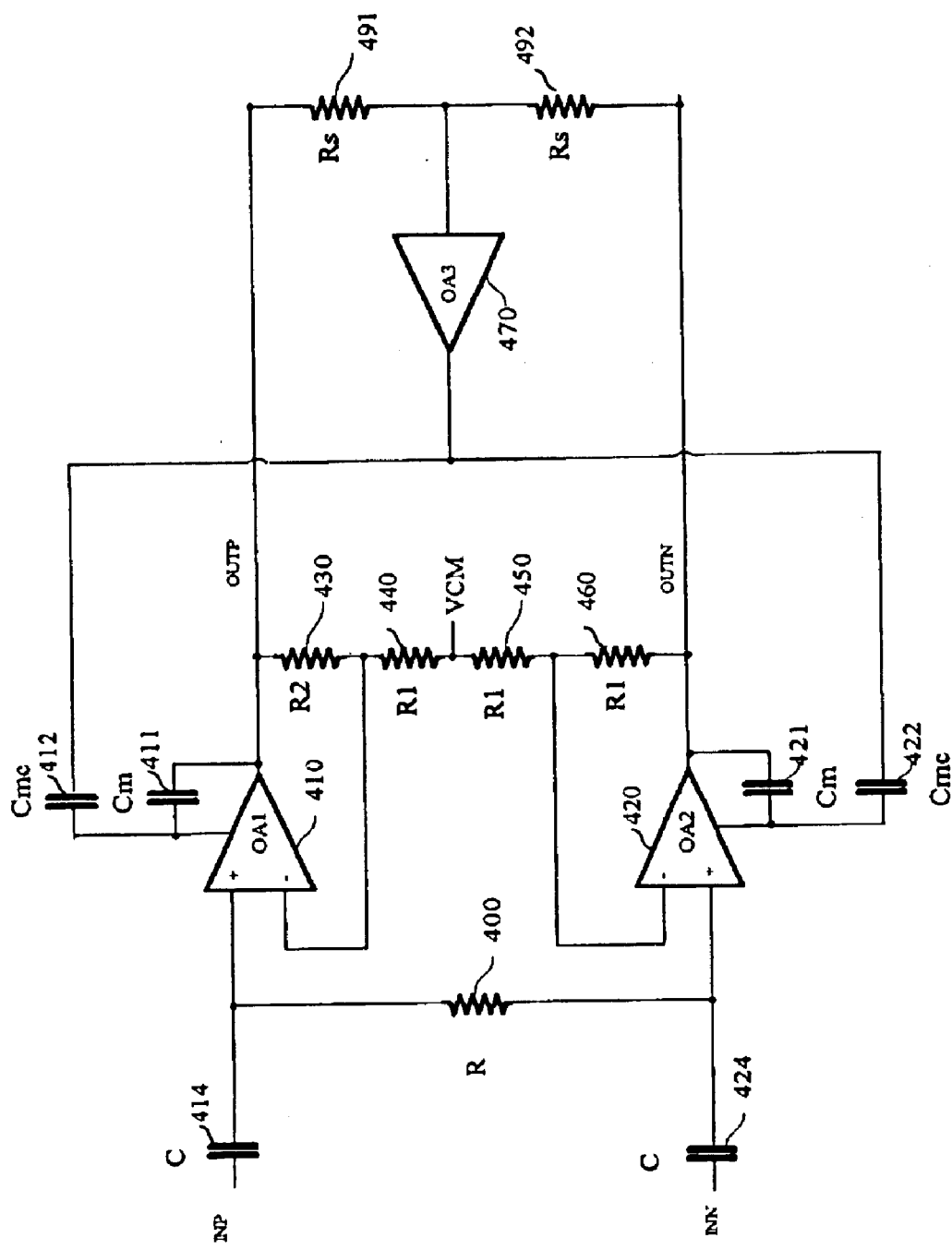
FIG. 4 shows a stabilization circuit according to a low noise amplifier structure of an embodiment of the invention.

FIG. 4 illustrates a stabilization circuit according to a low noise amplifier circuit of an embodiment of the invention comprising a first amplifier OA1 410 and a second amplifier OA2 420. Amplifiers 410 and 420 form any amplification circuit with a differential structure, especially low noise circuits, comprising any number of stages and made from semiconductor elements implemented with bipolar or MOS-type transistors.

Amplifier OA1 410 has an output electrode OUTP that is connected to a first electrode of a first resistor 430 that has a second electrode connected to a first electrode of a second resistor 440 that, in turn, has a second electrode connected to a first electrode of a third resistor 450. The third resistor 450 has a second electrode that is connected to a first electrode of a resistor 460 having a second electrode connected to an output OUTN of the second amplifier OA2.

Amplifier OA1 has a positive input connected to a first electrode of a first bypass capacitor C 414 that has a second electrode receiving an input signal INP. Amplifier OA1 has a negative input connected to the junction point of the first and second resistors 430 and 440, thus constituting a cascode amplifier stage having a gain that is set by the values R1 and R2 of resistors 430 and 440.

Similarly, amplifier OA2 has a positive input that is connected to the first electrode of a second bypass capacitor C 424, the second electrode of which receives an input signal INN. Amplifier OA2 further has a negative input that is connected to the junction point of the third and fourth resistors 450 and 460 in order to constitute, as previously, a second cascode amplifier stage.

The positive inputs of OA1 and OA2 receive a differential signal and a resistor 400 connected between these two positive inputs allows to set the input impedance of the amplifier circuit to a desired value. It will be noted that if a large value is chosen, the noise generated by resistor 400 is reduced because of the existence of bypass capacitors 414 and 424 that, together with resistor 400, form a noise-reducing low-pass filter.

Each of the amplifiers OA1 410 and OA2 420 is stabilized by a stabilization circuit including two stabilization capacitors mounted in series.

More specifically, amplifier OA1 410 is stabilized by a first stabilization circuit comprising, connected in series, a first Miller capacitor 411, with a capacitance Cm, having a first electrode connected to output OUTP and a second electrode connected to a first electrode of a first trimming capacitor 412 that has a capacitance Cmc. The common electrode of capacitors 411 and 412 is connected to the last stage input of amplifier OA1. As described later, trimming capacitor 412 completes the effect of the Miller capacitor in a different way according to whether it operates in common mode or in differential mode.

Similarly, amplifier OA2 420 is stabilized by a second stabilization circuit comprising, mounted in series, a second Miller capacitor 421, also having a capacitance Cm, that has a first electrode connected to output OUTN and a second electrode connected to a first electrode of a second trimming capacitor 422 of capacitance Cmc. As previously, the common electrode to capacitors 421 and 422 is connected to the input of the last stage of amplifier OA2 420 so as to benefit from the gain drop effect around high frequencies.

First and second trimming capacitors 412 and 422 have a second electrode connected to the output of a cascode stage 470 that has an input receiving the midpoint voltage of a resistive bridge Rs formed by two resistors 491 and 492.

As will now be shown, the presence of a cascode stage, which could very simply be implemented with a MOS-type transistor in series with a power source (not shown), makes it possible to modify the effect of capacitors 412 and 422 according to whether one is operating in differential mode or in common mode.

Figure 1:
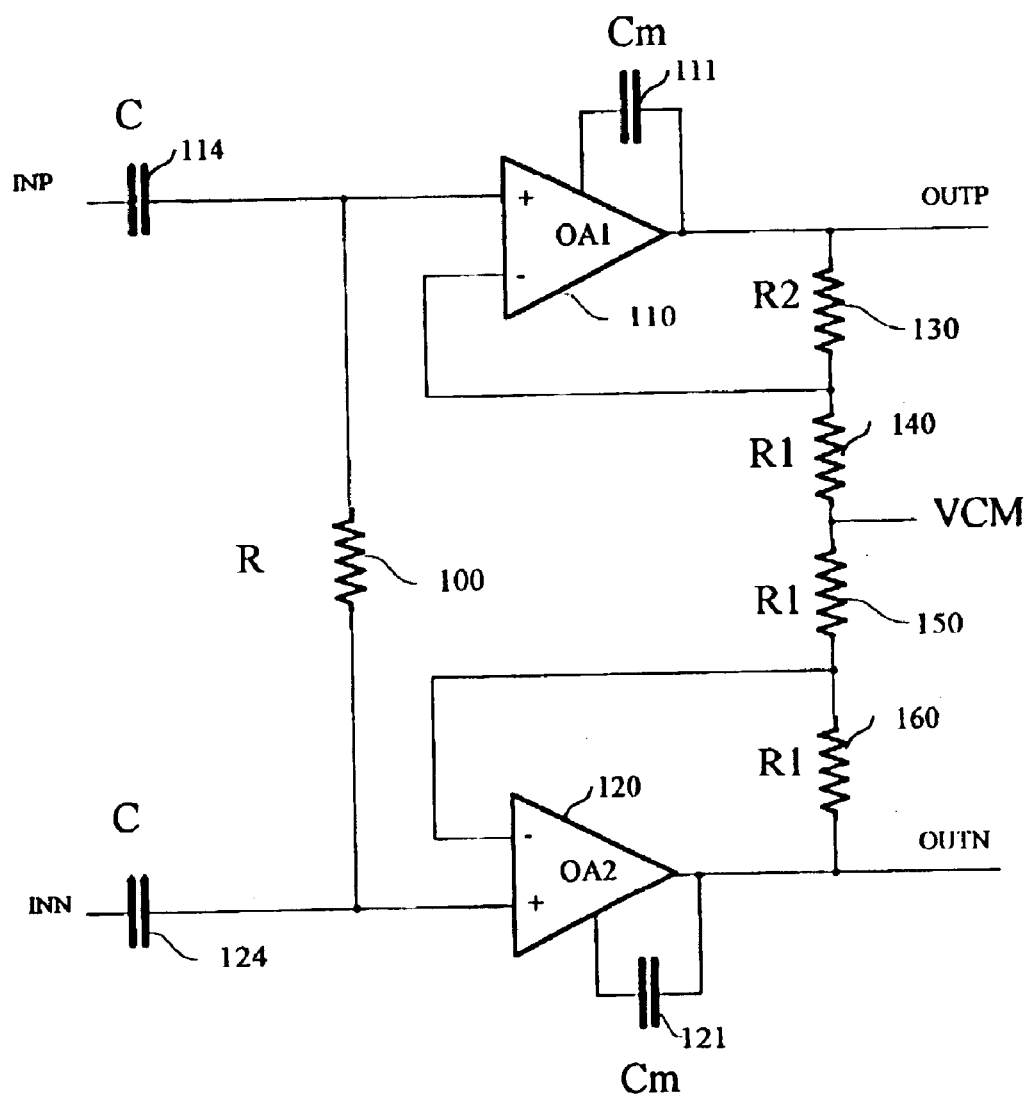
FIG. 1 illustrates a known architecture for a low noise amplifier circuit.
Figure 2:
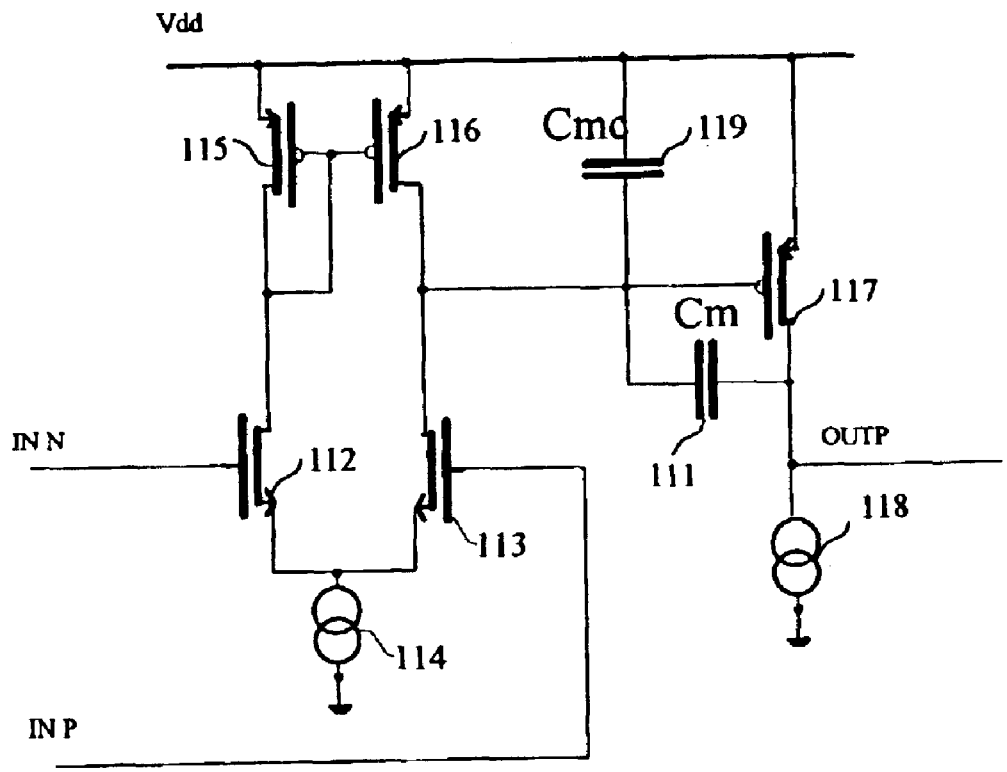
FIG. 2 is a view showing the use of a Miller or trimming capacitor in a known amplifier stage.
Figure 3:
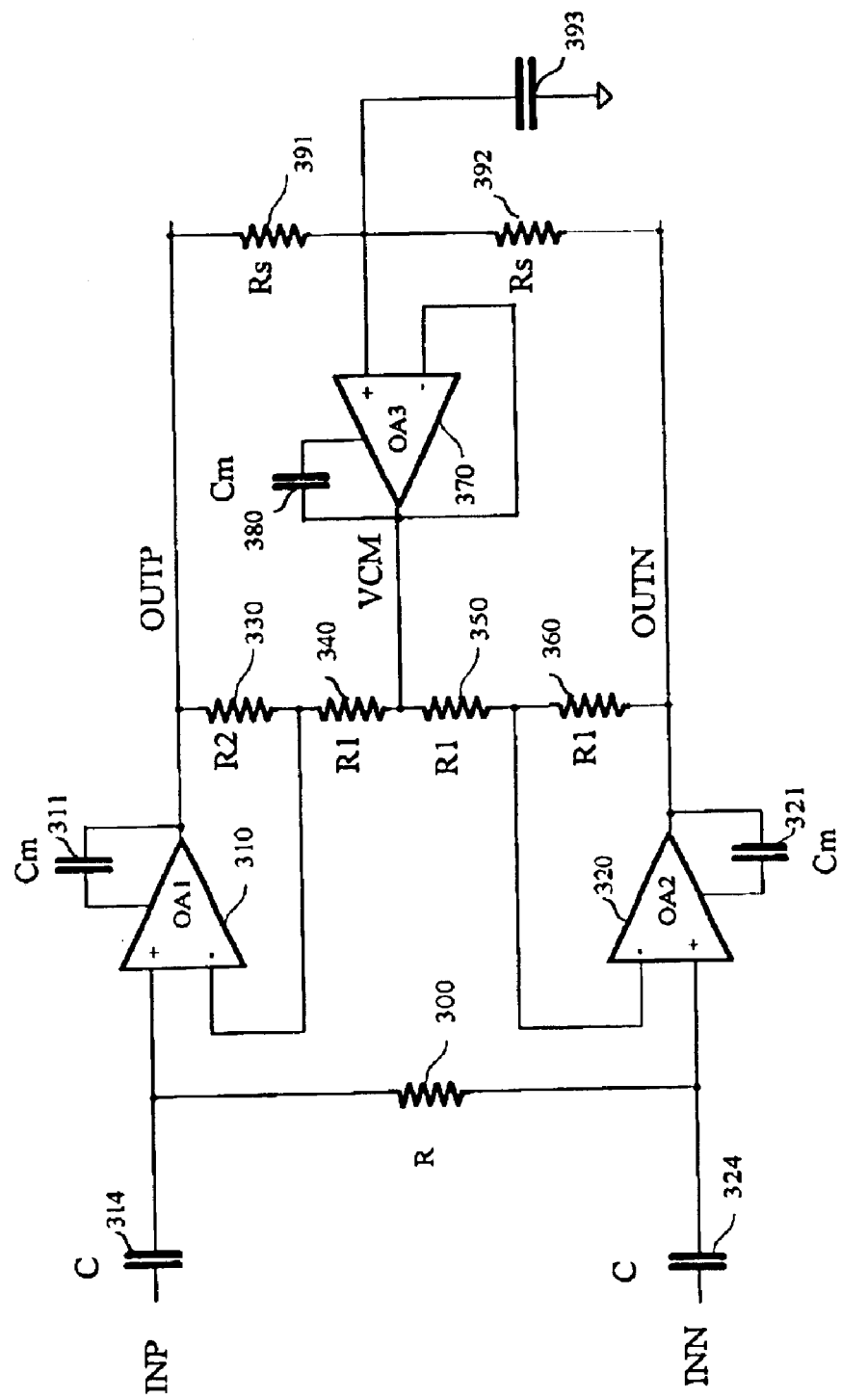
FIG. 3 shows a known common and differential mode stabilization circuit in a low noise amplifier.

In differential mode, the midpoint of both resistors 491 and 492 stays fixed, so that the output of the cascode stage is a virtual ground. As a result, capacitors 412 and 422 together have an effect that is identical to capacitor 119 in FIG. 2, i.e., not very significant compared to the Miller effect. More precisely, if K is the gain of the last stage of stabilized amplifier OA1 or OA2, it is observed that, in differential mode, the Miller capacitor equivalent to capacitor assembly 411–412 (resp. 421–422) is given by the formula:

$$Cequivalent = Cm + Cmc/k$$

Thus, if the value of gain K is large, then the Miller capacitor equivalent to the structure of FIG. 4 will be close to Cm.

On the contrary, in common mode it is observed that the midpoint of resistive bridge 491–492 tends to follow the common variations of both outputs OUTP and OUTN. So, that comes down to connecting the second electrode of capacitors 412 and 422 to outputs OUTP and OUTN, respectively, i.e., to connect them in parallel with Miller capacitors 411 and 421.

As a result, in common mode, the Miller capacitor equivalent to the structure of FIG. 4 is given by the formula:

$$Cequivalent = Cm + Cmc$$

Thus, through cascode circuit 470—which is easily implemented as previously shown—the effect of capacitor 412—respectively 422—can be discriminated according to whether it operates in common mode or in differential mode. Thus, through judicious choice of both capacitors Cm and Cmc, it becomes very easy to obtain an effective stabilization of the amplifiers, in common mode as well as in differential mode and, without impeding performances in differential mode.

Figure 5:
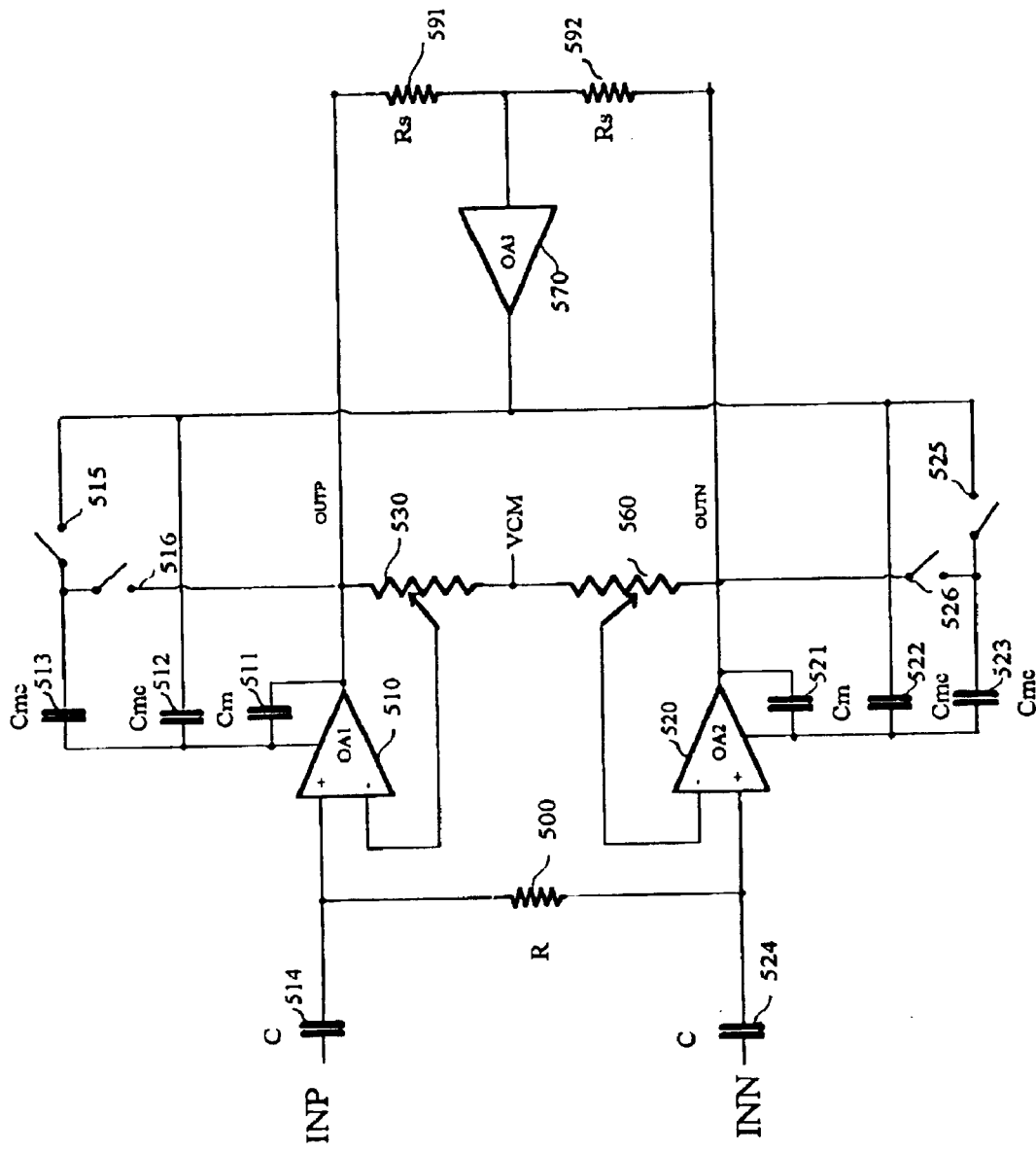
FIG. 5 shows an embodiment of a stabilization circuit for a variable gain amplifier structure.

FIG. 5 shows how the circuit of FIG. 4 can be adapted to realize a variable gain amplifier circuit. Elements 500, 510, 514, 520, 524, 570, 591 and 592 are identical to elements 400, 410, 414, 420, 424, 470, 491 and 492 in FIG. 4, respectively.

More precisely, the circuit comprises a first amplifier 510 and a second amplifier 520 each having an output electrode—OUTP and OUTN respectively—to which are connected two potentiometers 530 and 560 mounted in series.

Amplifier 510 (resp. 520) comprises, as previously, a positive input that receives signal INP (resp. INN) via a bypass capacitor 514 (resp. 524). The inverting input of amplifier 510 (resp. 520) is connected to the mobile electrode of potentiometer 530 (resp. 560) to modify the gain of the amplifier.

Amplifier 510 is stabilized by a first stabilization circuit that comprises a first Miller capacitor 511, of value Cm, associated with a set of trimming capacitors of value Cmc. FIG. 5 shows a set of two trimming capacitors 512 and 513 respectively. Capacitor 511 and each trimming capacitor have a common electrode that is connected to the input of the last stage of the considered amplifier. Capacitor 511 has a second electrode that is connected to output OUTP while capacitor 512 has a second electrode that is connected to the output of a cascode stage 570 the input of which is connected to the midpoint of a resistive bridge comprised of resistors 591 and 592. Capacitor 513 has a second electrode that is connected to a first electrode of a first switch 515 and to a first electrode of a second switch 516. First switch 515 has a second electrode connected to the output of cascode stage 570 while second switch 516 has a second electrode connected to output OUTP. Thus, both switches 515 and 516 make it possible to connect capacitor 513 either in parallel with Miller capacitor 511, or in parallel with trimming capacitor 512.

Similarly, amplifier 520 is stabilized by a second stabilization circuit that comprises a second Miller capacitor 521, of value Cm, associated with a set of trimming capacitors, of value Cmc, for example 522 and 523 as illustrated in FIG. 5. Capacitor 521 has a second electrode that is connected to output OUTP while capacitor 522 has a second electrode that is connected to the output of the cascode stage 570. Capacitor 523 has a second electrode that is connected to a first electrode of a first switch 525 and to a first electrode of a second switch 526. The first switch 525 has a second electrode connected to the output of the cascode stage 570 while the second switch 526 has a second electrode connected to output OUTN.

Thus, through switches 515, 516, 525 and 526, capacitors 513 and 523 can be connected either in parallel with Miller capacitors, respectively 511 and 521, or in parallel with trimming capacitors 512 and 522.

Thus, with this circuit it is possible to easily modify gain and to obtain optimal compensation of the loops, in differential mode as well as in common mode, by switching enough trimming capacitors to keep them in the compensation loop.

Figure 6:
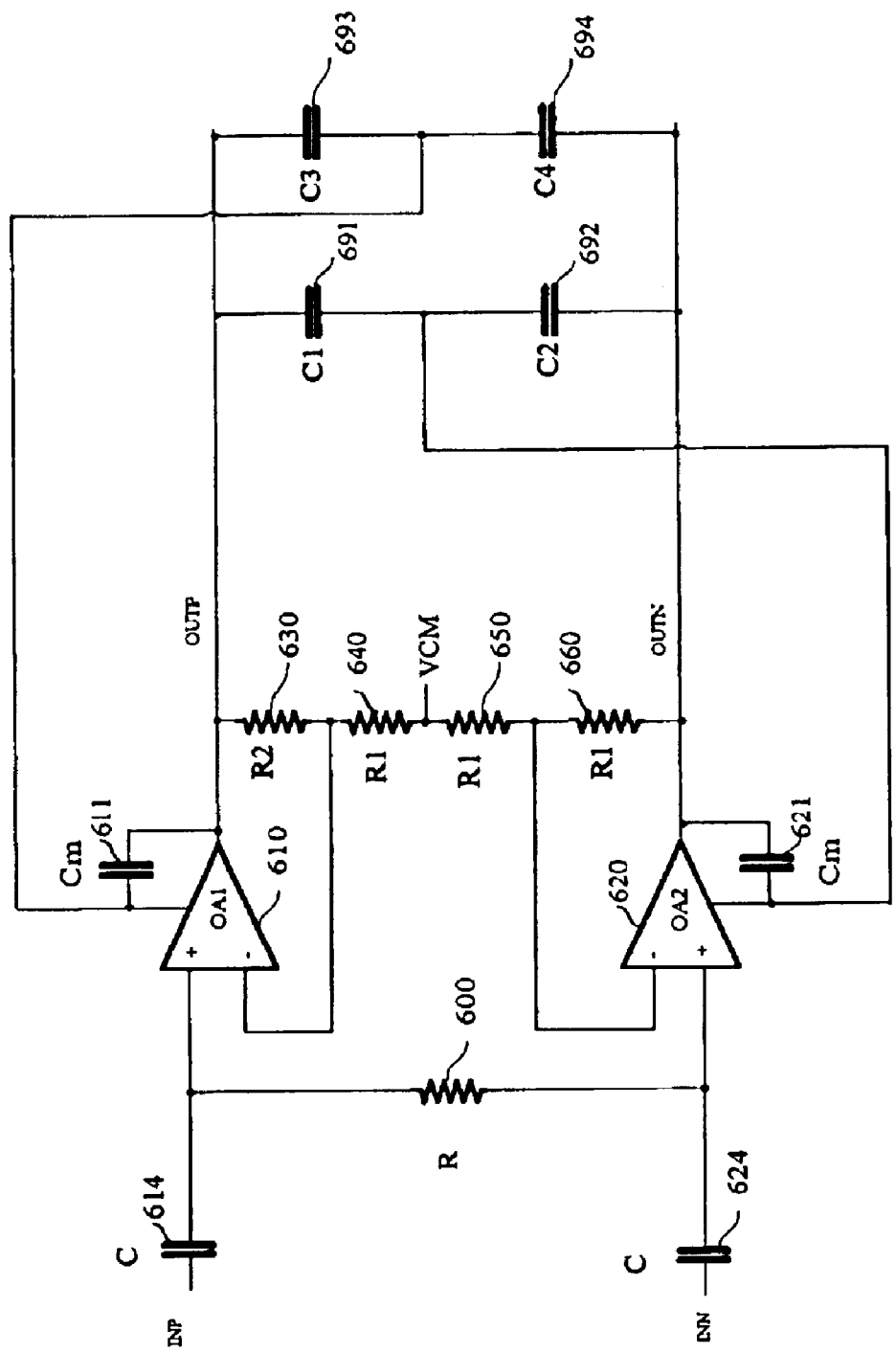
FIG. 6 illustrates another embodiment for significantly reducing supply current.

FIG. 6 shows another embodiment for obtaining a capacitor differentiation effect according to whether one is operating in common mode or differential mode while reducing current consumption through removal of amplifier AO3.

Elements 600, 610, 614, 620, 624, 630, 640, 650 and 660 are identical to elements 400, 410, 414, 420, 424, 430, 440, 450 and 460 of FIG. 4, respectively.

More precisely, the circuit comprises a first amplifier 610 and a second amplifier 620 each having an output electrode—OUTP and OUTN respectively. Output electrode OUTP is connected to a first electrode of a first resistor 630 that has its second electrode connected to a first electrode of a second resistor 640 that, in turn, has a second electrode connected to a first electrode of a third resistor 650. The third resistor 650 has a second electrode that is connected to a first electrode of a resistor 660 having a second electrode connected to an output OUTN of the second amplifier OA2.

Amplifier 610 (resp. 620) comprises, as previously, a positive input that receives signal INP (resp. INN) via a bypass capacitor 614 (resp. 624). The inverting input of amplifier 610 (resp. 620) is connected to the midpoint of resistors 630 and 640 (resp. midpoint of resistors 650 and 660).

Amplifier 610 is stabilized by a first stabilization circuit that comprises a first Miller capacitor 611, of value Cm, associated with a set of two trimming capacitors 693 and 694, of values C3 and C4 respectively, that are connected in series between electrodes OUTP and OUTN, and their midpoint is connected to the input of the last stage of amplifier 610. More precisely, capacitor 693 has a first electrode connected to output OUTP and a second electrode connected to a first electrode of capacitor 694 that has a second electrode connected to output electrode OUTN. The midpoint of these two capacitors is connected to an electrode of capacitor 611 that is in turn connected to the input of the last stage of amplifier 610.

Similarly, amplifier 620 is stabilized by a second stabilization circuit that comprises a second Miller capacitor, of value Cm, associated with a set of two trimming capacitors 691 and 692, of values C1 and C2 respectively, and that is connected in series between OUTP and OUTN. Similarly as previously, capacitor 691 has a first electrode connected to output OUTP and a second electrode connected to a first electrode of capacitor 692 that has its second electrode connected to output electrode OUTN. The midpoint of these two capacitors is connected to an electrode of capacitor 621 that is in turn connected to the last stage input of amplifier 620.

It is observed that, in common mode, capacitors 691 and 692 (resp. 693 and 694) are connected in parallel compared to capacitor 621 (resp. 611). As a result, for capacitors 691 and 692, an equivalent Miller capacitance is obtained that is equal to:

$$Cequivalent = Cm + C1 + C2$$

On the other hand, in differential mode, the effects of capacitors 691 and 692 (resp. 693 and 694) are "subtracted", so that the obtained equivalent Miller capacitance is lower than the equivalent Miller capacitance obtained in common mode. More specifically, for capacitors 691 and 692, the value of the equivalent Miller capacitance will be:

$$Cequivalent = Cm + C2 - C1$$

Whereas for capacitors 693 and 694, the value of the equivalent Miller capacitance will be:

$$Cequivalent = Cm + C3 - C4$$

By carefully adjusting capacitances C1, C2, C3 and C4, in particular so that C2=C3 and C1=C4, it is possible to set Cequivalent=Cm. Thus, as for the circuit of FIG. 4 but with much less current consumption, stabilization of the common mode can be obtained while preserving the circuit's performance in differential mode, i.e., maintaining gain-band product in the whole frequency band. Moreover, the area occupied by capacitors on the semiconductor is considerably reduced.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A low noise amplifier circuit including:
   a first amplifier comprising an output stage;
   a first Miller capacitor having a first electrode and a second electrode, said first and second electrodes of said first Miller capacitor being connected to an input and an output of said output stage of the first amplifier, respectively;
   a second amplifier comprising an output stage; and
   a second Miller capacitor having a first electrode and a second electrode, said first and second electrodes of said second Miller capacitor being connected to an input and an output of said output stage of the second amplifier, respectively;
   wherein the amplifier circuit comprises:
      a first trimming capacitor having a first electrode and a second electrode, said first electrode being connected to said first electrode of said first Miller capacitor;
      a second trimming capacitor having a first electrode and a second electrode, said first electrode being connected to said first electrode of said second Miller capacitor; and
      a cascode stage having an input and an output, said cascode stage input being connected to a midpoint of a resistive bridge connected between the output of said first amplifier and the output of said second amplifier; said output of the cascode stage being connected to the second electrode of said first and second trimming capacitors.

2. The amplifier circuit according to claim 1, further comprising a first, a second, a third and a fourth resistor between the outputs and of said first and second amplifiers, said first amplifier having a positive input receiving an input signal and a negative input that is connected to a midpoint between the first and second resistors, said second amplifier having a positive input receiving an input signal and a negative input connected to a midpoint between the third and fourth resistors.

3. The amplifier circuit according to claim 1 wherein said cascode stage is implemented with a MOS-type transistor in series with a power source.

4. The amplifier circuit according to claim 1 wherein the amplifier circuit comprises a variable gain amplifier circuit.

5. A low noise amplifier circuit including:
   a first amplifier comprising at least an input stage and an output stage;
   a first Miller capacitor having a first electrode and a second electrode, said first and second electrodes of said first Miller capacitor being connected to an input and an output of said output stage of the first amplifier, respectively;
   a second amplifier comprising at least an input stage and an output stage; and
   a second Miller capacitor having a first electrode and a second electrode, said first and second electrodes of said second Miller capacitor being connected to an input and an output of the output stage of said second amplifier, respectively;
   wherein the amplifier circuit comprises:
      a first set of trimming capacitors each having a first electrode and a second electrode, said first electrodes being connected to said first electrode of said first Miller capacitor;
      a second set of trimming capacitors having a first electrode and a second electrode, said first electrodes being connected to said first electrode of said second Miller capacitor; and
      a cascode stage having an input and an output, said cascode stage input being connected to a midpoint of a resistive bridge connected between the output of said first amplifier and the output of said second amplifier, said output of the cascode stage being connectable with the second electrode of each one of said trimming capacitors.

6. The amplifier circuit according to claim 5 wherein some of said trimming capacitors of said first and second sets are associated with a switch to disconnect them from a compensation loop.

7. A low noise amplifier circuit including:
   a first amplifier comprising an output stage;
   a first Miller capacitor having a first electrode and a second electrode, said first and second electrodes of said first Miller capacitor being connected to an input and an output of said output stage of the first amplifier, respectively;
   a second amplifier comprising an output stage; and
   a second Miller capacitor having a first electrode and a second electrode, said first and second electrodes of said second Miller capacitor being connected to an input and an output of said output stage of the second amplifier, respectively;
   wherein the amplifier circuit comprises:
      a first trimming circuit including:
         a first capacitor comprising a first electrode and a second electrode, the first electrode being connected to the output of said first amplifier; and
         a second capacitor comprising a first electrode and a second electrode, said first electrode of said second capacitor being connected to said second electrode of said first capacitor and to said first electrode of said second Miller capacitor, said second electrode of said second capacitor being connected to the output of said second amplifier; and
      a second trimming circuit including:
         a third capacitor comprising a first electrode and a second electrode, the first electrode being connected to the output of said first amplifier; and
         a fourth capacitor comprising a first electrode and a second electrode, said first electrode of said fourth capacitor being connected to said second electrode of said third capacitor and to said first electrode of said first Miller capacitor, said second electrode of said fourth capacitor being connected to the output of said second amplifier.

8. The amplifier circuit according to claim 7, further comprising a first, a second, a third and a fourth resistor between the outputs of said first and second amplifiers, said first amplifier having a positive input receiving an input signal and a negative input that is connected to a midpoint between the first and second resistors, said second amplifier having a positive input receiving an input signal and a negative input connected to a midpoint between the third and fourth resistors.

9. The amplifier circuit according to claim 5, further comprising a pair of potentiometers coupled in series between the outputs of the first and second amplifiers.

10. An apparatus, comprising:
first and second amplifiers respectively coupled to first and second Miller capacitors;
a first trimming capacitor circuit having a first terminal coupled to the first Miller capacitor and having a second terminal;
a second trimming capacitor circuit having a first terminal coupled to the second Miller capacitor and having a second terminal; and
a circuit stage coupled to the second terminals of the first and second trimming capacitor circuits, the circuit stage being coupled to modify an effect of the first and second trimming capacitor circuits according to operation in differential mode and operation in common mode.

11. The apparatus of claim 10 wherein the first trimming capacitor circuit includes a first trimming capacitor having a first electrode coupled to an electrode of the first Miller capacitor and having a second electrode, and wherein the second trimming capacitor circuit includes a second trimming capacitor having a first electrode coupled to an electrode of the second Miller capacitor and having a second electrode.

12. The apparatus of claim 11 wherein the circuit stage comprises a cascode stage having an input terminal and an output terminal, the input terminal of the cascode stage being coupled to a resistive bridge coupled between output terminals of the first and second amplifiers, the output terminal of the cascode stage being coupled to the second electrodes of the first and second trimming capacitors.

13. The apparatus of claim 10 wherein the first trimming capacitor circuit includes a first set of trimming capacitors each having a first electrode and a second electrode, the first electrodes being connected to an electrode of the first Miller capacitor,
wherein the second trimming capacitor circuit includes a second set of trimming capacitors each having a first electrode and a second electrode, the first electrodes being connected to an electrode of the second Miller capacitor, and
wherein the circuit stage includes a cascode stage having an input terminal and an output terminal, the input terminal of the cascode stage being coupled to a resistive bridge coupled between output terminals of the first and second amplifiers, the output terminal of the cascode stage being selectively connectable with the second electrode of at least one capacitor from each of the sets of trimming capacitors.

14. The apparatus of claim 10, further comprising a plurality of potentiometers coupled between the output terminals of the first and second amplifiers.

15. The apparatus of claim 10 wherein the first trimming capacitor circuit includes:
a first capacitor having a first electrode and a second electrode, the first electrode of the first capacitor being coupled to an output terminal of the first amplifier; and
a second capacitor having a first electrode and a second electrode, the first electrode of the second capacitor being coupled to the second electrode of the first capacitor and to an electrode of the second Miller capacitor, the second electrode of the second capacitor being coupled to an output terminal of the second amplifier,
wherein the second trimming capacitor circuit includes:
a third capacitor having a first electrode and a second electrode, the first electrode of the third capacitor being coupled to the output terminal of the first amplifier; and
a fourth capacitor having a first electrode and a second electrode, the first electrode of the fourth capacitor being coupled to the second electrode of the third capacitor and to the first electrode of the first Miller capacitor, the second electrode of the fourth capacitor being coupled to the output terminal of the second amplifier.

\* \* \* \* \*